United States Patent [19]

Komatsu et al.

[11] 4,412,119

[45] Oct. 25, 1983

[54] METHOD FOR DRY-ETCHING

[75] Inventors: Hideo Komatsu, Hinodemachi; Shinya Iida, Tama; Tatsumi Mizutani, Kodaira; Kazuyoshi Ueki, Ohme, all of Japan

[73] Assignee: Hitachi, Ltd., Tokyo, Japan

[21] Appl. No.: 260,813

[22] Filed: May 5, 1981

[30] Foreign Application Priority Data

May 14, 1980 [JP] Japan ................... 55-62815

[51] Int. Cl.³ ........................................ H01L 21/306
[52] U.S. Cl. ........................ 219/121 PF; 156/643; 156/646; 204/192 E; 219/121 PE
[58] Field of Search .............. 219/121 PD, 121 PE, 219/121 PF, 121 EK; 156/643, 646, 628; 204/192 E

[56] References Cited

U.S. PATENT DOCUMENTS 4,243,476 1/1981 Ahn et al. ...................... 156/643

OTHER PUBLICATIONS

Coburn, "Increasing the Etch . . . Etching", IBM Disclosure, vol. 19, No. 10, 3–1977, p. 3854.
Desilets et al. "Reactive Species . . . Compound", IBM Disclosure, vol. 22, No. 1, 6–1976, 9186, p. 112.

*Primary Examiner*—M. H. Paschall
*Assistant Examiner*—Alfred S. Keve
*Attorney, Agent, or Firm*—Antonelli, Terry & Wands

[57] ABSTRACT

A dry-etching method for working $SiO_2$, phospho-silicate glass, Si, Mo, W, Cr, TiW, $Si_3N_4$ or the like by the use of a glow discharge plasma involves the steps of introducing He, Ar, $N_2$, $O_2$ or a mixed gas thereof into a reaction chamber from the outside; and effecting the plasma discharge in the reaction chamber so that a reactive gas is liberated from a high molecular resin material arranged in the reaction chamber and containing fluorine atoms. The dry-etching method requires and uses no expensive gas containing a fluorocarbon, but has sufficient etching rate and selectivity.

16 Claims, 2 Drawing Figures

METHOD FOR DRY-ETCHING

BACKGROUND OF THE INVENTION

The present invention relates to a dry-etching method making use of a glow discharge plasma, and more particularly to a method for selectively etching a material for a semiconductor device such as silicon, molybdenum, tungsten, chromium, TiW, silicon dioxide, phosphosilicate glass or silicon nitride by the use of a plasma etcher having a parallel plate electrode structure.

Recently, the sizes of the electronic parts of a semiconductor integrated circuit or the like are becoming finer and finer, and the technique of the so-called "dry-etching method" making use of gas plasmas has accordingly made rapid progress as the technique which can work a selected material highly accurately and finely, in place of the conventional wet-etching method using a liquid. Especially, in the plasma etcher having a parallel plate electrode structure, the selective etching of Al, an Al alloy, silicon dioxide and so on can be made, and practical investigations of this process are being advanced.

Upon the fabrication of the semiconductor integrated circuit or the like, incidentally, a silicon compound such as silicon oxide, phosphosilicate glass or silicon nitride is widely used as an electrically insulating film for separation of elements and between layers, a mask for etching, diffusion, oxidization or ion implantation, or a protecting film. In accordance with the prior art, as a gas for dry-etching these silicon compounds, or silicon polycrystal or molybdenum to be used as the gate material for a MOS transistor, there are used not only a fluorocarbon having a structure of $C_nF_{2n+2}$ represented by $CF_4$, and the fluorocarbon gas mixed with $O_2$ or an inert gas but also a fluorocarbon-containing gas such as $CCl_2F_2$, $CHF_3$ or $CBrF_3$ or a fluorine-containing compond such as $SF_6$, $BF_3$, $SiF_4$ or $NF_3$. However, all of those gases are expensive, and the use of such expensive gases raises an obstacle against the reduction in the cost for the dry-etching method.

For the purpose of practically using the dry-etching in the semiconductor fabricating process, on the other hand, it may be an important factor to etch a material at a higher rate possible than with a photoresist material providing an etching mask therefor on a surface for the material to be etched, i.e., to have a high level in the so-called "selectivity". Generally speaking, if a silicon compound such as a silicon dioxide film is dry-etched by the use of the aforementioned fluorocarbon-containing gas, the etching rate of the silicon dioxide is either lower than that of the photoresist or the silicon, or is not a practically sufficient rate even in case the rate is high. As a method for enhancing the selectivity, therefore, there has been found either a method, in which the aforementioned fluorocarbon gas is mixed with a gas containing hydrogen such as $H_2$, $H_2O$, $NH_3$ or $C_2H_4$, or a method in which a fluorocarbon gas is introduced and used as a gas for dry-etching and in which a high molecular material such as polyester or an ethylene tetrafluoride resin is arranged on the inner wall of a reaction chamber or on a target electrode (e.g., an r.f. electrode). In accordance with that method, fluorine radicals, which are dissociated under discharge from the fluorocarbon gas and which act as a highly reactive chemical etchant, are made to react with the hydrogen atoms in the mixed gas or in the target material and further with the $(CF_n)$-containing gas, which is generated from the target material, so that they are caused to restrain their reactions with the silicon or the photoresist thereby to selectively etch the silicon compound such as the silicon dioxide with a fraction of $CF_2$ or $CF_3$.

However, the method thus far described raises problems that the plasma polymerization under the plasma discharge becomes prominent to blot the surface of the sample or the inside of the reactor and that it becomes liable to reduce the etching rate of the silicon compound or to deteriorate the photoresist. Especially, the deterioration in the photoresist is an important problem and is followed by deformation so that the patterning accuracy is degraded to invite such practically serious obstacles that it becomes impossible to etch fine patterns less than 5 μm and difficult to remove the photoresist after the etching process. In the plasma etcher of parallel plates, generally speaking, the deterioration of the photoresist is the more liable to take place for the lower gas pressure and for the higher power density impressed, and the temperature rise on the surface of the sample as a result of the ion impact is considered to be one of the causes therefor. Therefore, if the gas pressure is increased and if the power density is decreased, it is possible to prevent that deterioration. In this particular case, however, the etching rate of the silicon compound is lowered so that the selectivity is remarkably reduced. On the other hand, in case the fluorocarbon-containing gas is used without mixing the gas containing the hydrogen atoms, the selectivity is improved the more for the higher molecular gas such as $C_3F_8$ or $C_4F_8$ than $C_2F_6$ or $C_2F_6$, and the far more than $CF_4$ or for a gas containing hydrogen atoms such as $CHF_3$. In that particular case, on the contrary, the deterioration of the photoresist is liable to take place, and the etching rate of the silicon compond is reduced. If the selectivity is to be improved at a practical etching rate in this manner, an adverse result is obtained in that the deterioration of the photoresist is liable to take place.

In order to prevent the photoresist from being deteriorated, incidentally, there has been proposed a method in which the thermal contact between a water-cooled target electrode and a sample is improved. This method is effective in more or less reducing that deterioration, but cannot substantially solve the problem. There are still left practical problems in workability, reproducibility and contamination in the etcher.

It is, therefore, the present technical state that there is no etching method capable of attaining both practially sufficient selectivity (the ratio in the etching rate of the material to be etched to another material is higher then ten times) and etching rate by the use of the fluorine compound or its gas mixed with another gas without being accompanied by the deterioration of the photoresist.

On the other hand, the special fluorocarbon gas having a relatively excellent selectivity such as $C_2F_6$, $C_3F_8$, $C_4F_8$ or $CHF_3$ is difficult to obtain and costs ten times or more as high as the later-described He or Ar gas which is to be used in the present invention, thus raising a serious problem when it is used in the mass-production process of a semiconductor.

The following references are cited to show the state of the art:

(i) Japanese Patent Laid-Open Publication No. 49-2482;

(ii) Japanese Patent Laid-Open Publication No. 52-114444;

(iii) Japanese Patent Laid-Open Publication No. 52-131469.

SUMMARY OF THE INVENTION

It is, therefore, an object of the present invention to provide a method for dry-etching a workpiece inexpensively by the use of a gas at a low price while eliminating the aforementioned difficulties concomitant with the prior art.

Another object of the present invention is to provide a dry-etching method capable of easily obtaining sufficient etching rate and selectivity.

A further object of the present invention is to provide a method for dry-etching a silicon compound such as silicon dioxide or phosphosilicate glass with more excellent etching characteristics than the conventional method without supplying any gas containing fluorine atoms from the outside.

In order to attain the aforementioned objects, a dry-etching method according to the present invention is intended to work on a workpiece by the use of a glow discharge plasma and comprises: the step (i) of introducing an inactive gas into a reaction chamber from the outside that is inactive with said workpiece even under a plasma discharge; and the step (ii) of effecting the plasma discharge in said reaction chamber so that a reactive gas that is reactive with said workpiece under the plasma discharge may be liberated from a material which is arranged in the reaction chamber.

DESCRIPTION OF THE PREFERRED EMBODIMENT

Figure 1:
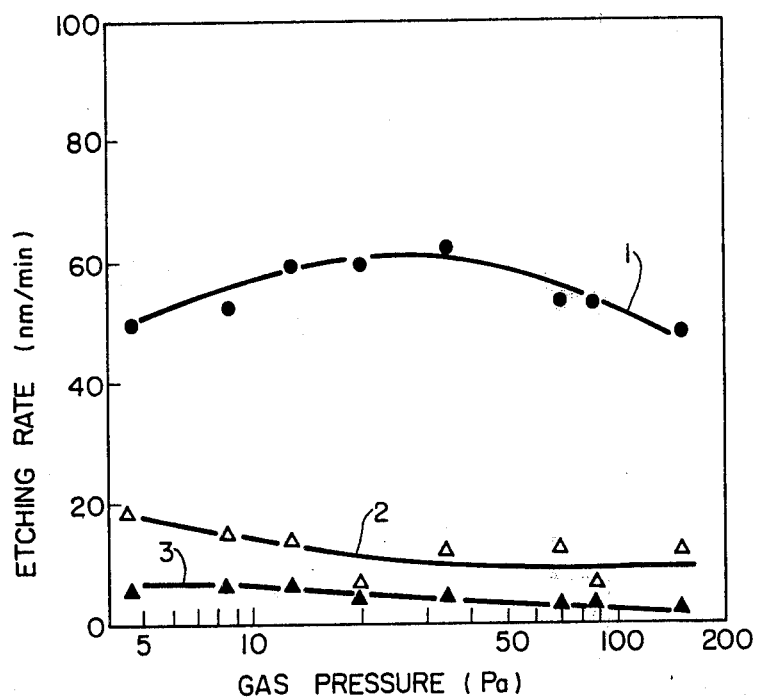
FIG. 1 is a graph illustrating the dependencies of the etching rates of phospho-silicate glass, photoresist and silicon upon the gas pressure according to one embodiment of the present invention.

In a dry-etching method according to the present invention, the surface of a workpiece is worked by the ions or radicals which are generated by a plasma that is composed of an atmosphere of a reactive gas liberated at the aforementioned step (ii). According to the dry-etching method of the present invention, more specifically, a workpiece is worked not by the plasma of the gas supplied from the outside but by the plasma of the gas which is liberated from a material arranged in a reaction chamber as a result of the reaction of that material with the plasma of the gas supplied from the outside.

Therefore, the gas to be introduced into the reaction chamber from the outside may be such an inactive gas as is inactive with the workpiece under the plasma discharge such as He, Ar, $N_2$ or $O_2$. What is selected as that inactive gas is determined by taking the kind of the workpiece into consideration. For example, in case the workpiece is $SiO_2$ or phospho-silicate glass, the aforementioned inactive gas may be at least one gas selected from the group consisting of He, Ar and $N_2$, and a high molecular resin containing fluorine atoms may be arranged in the reaction chamber. For the etching rate and the selectivity, He is the best, Ar is better, and $N_2$ is ranked third in the three. On the other hand, for example, in case the workpiece is made of Si, Mo, W, Cr, TiW or $Si_3N_4$, the aforementioned inactive gas may be either an $O_2$ gas or a gas containing $O_2$ (e.g., its mixed gas with He, Ar or $N_2$), and the material to be arranged in the reaction chamber may be a high molecular resin containing fluorine atoms, as is similar to the aformentioned case. Even if only such an inexpensive inactive gas is introduced into the reaction chamber, the etching can be sufficiently effected similarly to the case in which the gas containing fluorine atoms is used in the prior art. In case the $SiO_2$, phospho-silicate glass or the like is to be worked, moreover, the aforementioned selectivity is remarkably improved. As the aforementioned high molecular resin arranged in the reaction chamber and containing the fluorine atoms, it is possible to enumerate an polytetrafluorethylene resin, a polymonochlorotrifluoroethylene resin, an tetrafluoroethylenehexafluoropropylene copolymer resin, a polyvinylidenfluoride resin, a polyvinylfluoride resin and so on. Although it is customary to arrange only one of those materials in the reaction chamber, two or more of them may be made to coexist therein. In case such high molecular resin containing the fluorine atoms is arranged in the reaction chamber, the workpiece may be a material that can be worked by introducing the gas containing the fluorine atoms into the reaction chamber according to the prior art thereby to generate a plasma.

Although it is customary that the material to be arranged in the reaction chamber is placed on the electrode of the plasma etcher, it may be placed anywhere if it is in the plasma atmosphere. Moreover, the shape and size of that material should not be especially strictly restricted, but may be suitable for convenience of operations. However, in case an especially large or small shape or a unique shape is intended, its effect is desired to have been confirmed in advance by a preliminary experiment. In case this preliminary experiment has revealed that the result and effect are unsatisfactory, another preliminary experiment is performed for more normal shape and size. If the expected effect is resultantly confirmed, the dry-etching is performed under that size condition. Still moreover, the number of the materials to be arranged in the reaction chamber may be one or more.

The flow rate of the inactive gas to be introduced into the reaction chamber from the outside may be within such a range as can maintain the plasma discharge. In the case of uncertainty, the suitable range can be confirmed by a simple preliminary experiment.

On the other hand, if the supply of the aforementioned inactive gas is continued before the start of the plasma discharge and is subsequently interrupted, said discharge is maintained so that the workpiece is etched. This seems to come from the fact that the plasma discharge is maintained by the reactive gas which is liberated from the material arranged in the reaction chamber. It goes without saying that the supply of the inactive gas may not be interrupted, but always continued to the inside of the reaction chamber.

The allowable range of the total pressure of the gas in the reaction chamber is different in accordance with the kind of the workpiece, the density of the power impressed, the frequency of the power impressed and so on, but the pressure may usually be 1.3 to 1330 Pa and, preferably, 13 to 133 Pa. Incidentally, in case the $SiO_2$ or phospho-silicate glass is to be dry-etched as has been described in the above, the total pressure is the most preferred to be 20 to 50 Pa. This is because the etching rate and selectivity of the phospho-silicate glass becomes the highest and the best within that gas pressure range, as will be described later.

The density range of the power to be impressed for the plasma discharge may be similar to that of the prior art and is usually set to about 0.2 to 1 W/cm$^2$. The frequency of the power to be impressed may also be similar to that of the prior art.

Experiments have been conducted in which the polytetrafluorothylene resin was arranged on the target electrode (e.g., the r.f. electrode) and in which only the Ar gas was introduced into the reaction chamber thereby to effect the discharge, and it has been discovered that the material such as SiO$_2$ or phospho-silicate glass could be etched at a similar rate as that in case a fluorocarbon (CF$_4$) gas was introduced. It has also been found that the silicon compound could be similarly etched even in case the discharge was effected by introducing an inert gas such as He or N$_2$ or an O$_2$ gas in the presence of the polytetrafluoroethylene resin.

In that case, it has been made apparent that the selectivity for Si could be improved more than the case in which a fluorocarbon containing gas was used and that the selectivity for the photoresist could be remarkably improved in case He was used. In Table 1, there are tabulated the etching rates and their ratios (i.e., the selectivities) when the respective materials were dry-etched, in case the C$_3$F$_8$ gas was used and in case the He gas was used, while making the other conditions the same. The gas pressure was preset at 13 Pa. The polytetrafluoroethylene resin was placed in the reaction chamber. The etching rates of the phopho-silicate glass (PSG) are little different for the cases of the C$_3$F$_8$ and the He gas; whereas the etching rates of the silicon and the photoresist become smaller than those for the case of the He gas. As a result, the ratios in the etching rates between the phospho-silicate glass and the silicon and between the phospho-silicate glass and the photoresist are 2.8 and 1.8, respectively, for the He gas. FIG. 1 illustrates the dependencies of the etching rates upon the gas pressure when the He gas was used. The etching rate of the phospho-silicate glass, as indicated at a curve 1, takes its maximum in the vicinity of about 30 Pa, whereas the etching rates of the photoresist and the silicon, as indicated at curves 2 and 3, respectively, have a tendency to become the lower as the gas pressure becomes the higher. As a result, if the gas pressure range of 20 to 50 Pa is selected, the phospho-silicate glass can be etched at the rates of 12 to 16 and 6 to 8, respectively, for the silicon and the photoresist. Since, the the fluorocarbon-containing gas according to the prior art, the etching rate of the silicon dioxide or the phospho-silicate glass is remarkably reduced as the gas pressure is raised, it is impossible to attain selectivity of ten times or more for both the silicon and the photoresist without being accompanied by the deterioration of the photoresist. If the He or the like is used, the silicon compound can be etched under the conditions of the relatively high pressure and relatively low power density described in the above so that no deterioration of the photoresist will result.

TABLE 1

| Gas | Etching Rate (nm/min) | | | | | Etching Rate Ratio | |
|---|---|---|---|---|---|---|---|
| | PSG | SiO$_2$ | Si$_3$N$_4$ | Si | Photo-resist | PSG/Si | PSG/Photo-resist |
| C$_3$F$_8$ | 56 | 42 | 51 | 21 | 30 | 2.8 | 1.8 |
| He | 60 | 40 | 30 | 6 | 14 | 10 | 4.3 |

As has been described hereinbefore, according to the present invention, more excellent etching characteristics than those obtained in case a gas containing fluorine is supplied to the reaction chamber can be attained by supplying a gas containing no fluorine to the reaction chamber from the outside so that the gas sputtered by the resultant gas plasma from a material placed on the target electrode is made to selectively react with a silicon compound.

Incidentally, the etcher to be used in the dry-etching method according to the present invention need not be restricted to any special one, if it can etch with the plasma, but may usually be the "dipole parallel plate type etcher using a plasma", which is well-known in the semiconductor industry.

As has been described hereinbefore, one feature of the present invention resides in attaining an etching rate equal to or higher than that in case a reactive gas is supplied from the outside and in remarkably enhancing the etching selectivity the more than in case the reactive gas is supplied, merely by supplying such a gas to the reaction chamber from the outside as is inactive under the plasma discharge with a workpiece. More specifically, according to the so-called "reactive sputter etching method" of the prior art, the reaction chamber is supplied with the gas containing such atoms as can react under the plasma discharge with the material to be etched; whereas, according to the present invention, the reactive sputter etching can still be effected by supplying such a gas as cannot react with the material to be etched, which point is quite different from the prior art method.

Here, the present invention is advantageous, as has been described hereinbefore, not only in that the remarkably high etching selectivity can be attained without being followed by the deterioration in the photoresist and in that the price of the gas used is not high but also in the points relating to the system that the deterioration in a rotary pump for evacuation, which raises a problem in the case of the dry-etching process using a gas containing fluorine or chlorine, and that contamination by the polymer or the like either on the surface of a sample or in the etcher is reduced. Moreover, the monitor of the proceeding and end of the etching process by the use of the intensity of the light emitted from the plasma is made easier than that in case a fluorocarbon-containing gas is used. Thus, the present invention has more excellent points in practice than the conventional method using the fluorocarbon-containing gas.

If the present invention is further developed, it is possible to provide an etching method, in which there is absolutely no necessity for any gas to be supplied from the outside during the etching process. More specifically, even if the supply of a predetermined gas from the outside is interrupted after the gas is introduced into the reaction chamber, once this reaction chamber is evacuated and after a power of radio frequency is then impressed to effect the discharge (while continuing the evacuation), the etching process can be performed by maintaining the discharge only with the gas component which is liberated from the polytetrafluoroethylene resin. The etching characteristics in this development are little different from those of the afore-mentioned results.

DESCRIPTION OF THE PRESENTLY PREFERRED EMBODIMENTS

The present invention will now be described in more detail in conjunction with the Examples:

EXAMPLE 1

Figure 2:
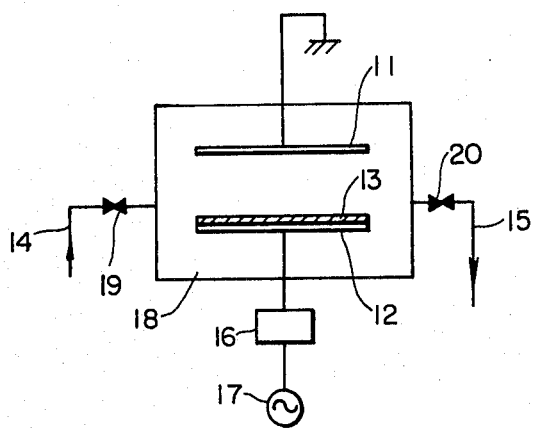
FIG. 2 is an explanatory view diagrammatically showing a plasma etcher used in the embodiment of the present invention.

A polytetrafluoroethylene disc 13 having a diameter of 300 mm and a thickness of 4 mm was arranged, as shown in FIG. 2, on the r.f. electrode of a plasma etcher having the parallel plate electrode structure. On the other hand, phospho-silicate glass (having a phosphorus concentration of 4 mole %) having a thickness of 600 nm, silicon dioxide having a thickness of 600 nm and silicon dioxide having a thickness of 500 nm, all of which are formed on a silicon wafer having a diameter of 78 mm, and a silicon wafer having a diameter of 78 mm were prepared and formed on their respective surfaces with photoresist patterns (having a thickness of about 1 μm) made of desired AZ1350J (which is known under the trade name of Shipley Co., Ltd., U.S.A.). The wafers thus prepared were placed on the aforementioned polytetrafluoroethylene disc 13. A He gas was supplied at a flow rate of 10 cc/min from a gas introduction system 14 and regulated at a predetermined gas pressure. An r.f. frequency power having a frequency of 13.56 MHz and a power density of 0.4 W/cm$^2$ was supplied from an r.f. power source 17 through a matching circuit 16 to a reaction chamber 18 for eight minutes. After that, the sample is taken out to remove the photoresist. The etching rates of the respective materials were determined by a method for measuring the steps between the portion having the photoresist applied thereto and the portion etched by the use of a step height meter (i.e., the "Talystep": which is known under the trade name of Taylor-Hobson Ltd., United Kingdom). The etching rate of the photoresist was determined by partially covering the photoresist with such a thin layer as will not be etched and by measuring the step between that portion and the etched portion. The measured results are tabulated in Table 1 and illustrated in FIG. 1. The results of Table 1 corresponds to the case in which the gas pressure was 13 Pa. Also, the results, which were obtained by supplying $C_3F_8$ gas as the fluorocarbon gas and by measuring the etching rates of the respective materials by the same method as the aforementioned one, are tabulated as one example of the conventional method in Table 1 for comparison.

In FIG. 2, reference numerals 11, 12, 15, and 19 and 20 indicate a ground electrode, an r.f. electrode, an evacuating system, and valves, respectively.

In cases when the He gas was used, the phospho-silicate glass and the silicon dioxide could be etched at similar rates as those in case the $C_3F_8$ is used according to the conventional method, and the etching rates of the silicon and the photoresist were ½ to ⅓ or less as high as that in the case of the $C_3F_8$. It therefore follows that the selectivity could be improved two to three times as high as that of the conventional method. Moreover, if the gas pressure is raised, there is a tendency for the selectivity to be improved. As will be understood from FIG. 1, for example, under the pressure condition of 20 Pa, the phospho-silicate glass could be etched at a rate of 16 times and eight times as high as those of the silicon and the photoresist, respectively.

EXAMPLE 2

Using the procedures of Example 1, Ar and $N_2$ gases were supplied in place of the He gas and were discharged. The gas pressure was preset at 20 Pa, and the remaining conditions were all made similar to those of Example 1. As a result, the silicon compound could be selectively etched for the Ar and $N_2$ gases similarly to the case of the He gas, and the phospho-silicate glass could be etched at a rate of four to eight times and about three times as high as those for the silicon and for the photoresist, respectively. Thus, the selectivity is more excellent for the He used in Example 1 than for the Ar and $N_2$ used in the present Example.

EXAMPLE 3

Using the procedures of Example 1, an $O_2$ gas was supplied in place of the He gas and was discharged. The gas pressure was preset at 20 Pa, and the remaining conditions were all made similar to those of Example 1. The results revealed that the etching rate of the silicon nitride was about five and seven times as high as those of the phospho-silicate glass and the silicon dioxide, respectively, and that the etching rate of the silicon was about 2.3 times and 3.5 times as high as those of the phospho-silicate glass and the silicon dioxide, respectively.

By the use of the aforementioned discharged plasma of the $O_2$ gas, moreover, the polycrystalline silicon, which had been formed through the silicon dioxide on the silicon wafer having a diameter of 75 mm by the CVD method (i.e., the Chemical Vapor Deposition method), and the titanium-tungsten alloy and molybdenum, which had been formed on the same silicon wafer by the sputtering method, could be etched at rates of 73 nm/min, 65 nm/min and 93 nm/min, respectively.

EXAMPLE 4

Two wafers, which had been prepared by forming the phospho-silicate glass (having a phosphor concentration of 4 mole %) having a thickness of 600 nm on a silicon wafer having a diameter of 78 mm by the CVD method and by forming the photoresist patterns on AZ1350J having a thickness of 1000 nm thereupon, were etched in a similar manner to that of Example 1. The gas pressure was preset at 33 Pa, and the supply time of the r.f. power was 12 minutes. It could be confirmed by the measurements of the etching depths with the use of a step height meter and by the observations with the use of an optical nicrometer after the etching processes that the phospho-silicate glass had been completely etched for both the two wafers. In this instance, no deterioration of the photoresist was found, but a thickness of about 880 nm was left so that the reduction as a result of the etching process was only 120 nm. On the other hand, the surfacing silicon was little etched (that is to say, the etched depth, if any, was about 50 nm at the maximum). Moreover, a scanning electron microscope could observe in the wafer section one of the so-called "undercut phenomena", in which the portion below the photoresist mask is etched, and the patterns having widths and intervals of 1 μm at the minimum just according to the photoresist mask.

EXAMPLE 5

A polytetrafluoroethylene resin was applied not to the r.f. electrode 12, as in Example 1, but to the ground electrode 11 (i.e., the counter electrode). The results revealed that the silicon compound could be etched in a similar manner to that of Example 1 and that the selectivity was little different from that of Example 1. Therefore, the arranging method of the ethylenes tetrafluoride resin may be made either upon the r.f. electrode, on which the sample is to be placed, or upon the ground electrode at the opposite side and should not be especially limited. Moreover, no matter where the polytetrafluoroethylene resin may be placed in the reaction chamber other than on the electrode, similar effects can be attained if the gas is liberated from the plasma discharge. On the other hand, in case the polytetrafluoroethylene resin is placed on the electrode, it need not be placed all over the electrode, but sufficient effects can be expected if that resin is placed to cover only the surrounding portion of the sample wafer or only a portion of the electrode. Thus, there is no limitation in the shape of the arrangement of that resin.

EXAMPLE 6

Using the procedures of Example 1, a polymonochlorotrifluoroethylene resin was arranged in place of the polytetrafluoroethylene resin. In this Example, the silicon compound could be etched at a higher rate than those of the silicon and the photoresist. The selectivity was slightly inferior to the case of the polytetrafluoroethylene resin but was superior to the conventional method. Moreover, the aforementioned effects can be attained, not only for the aforementioned materials but for an tetrafluoroethylene hexafluoropropylene copolymer resin, a resin polyvinylidenefluoride resin and a polyvinylfluoride resin, all of which are fluoride containing resins.

EXAMPLE 7

A phospho-silicate glass was etched similarly to Example 1 except that the valve 19 was closed to interrupt the supply of the He gas after the He gas had been supplied and the r.f. power had been impressed and discharged. Substantially similar effects to those of FIG. 1 could be obtained.

Since numerous changes and different embodiments of the present invention may be made without departing from the spirit and scope thereof, it is intended that all matters contained in the description shall be interpreted as illustrative of the invention.

What is claimed is:

1. A drying-etching method for working the surface of a workpiece by the use of a glow discharge plasma comprising: a step of positioning a workpiece within a reaction chamber, a step (i) of introducing into said reaction chamber from the outside helium gas that is inactive with said workpiece even under a plasma discharge; and a step (ii) of effecting the plasma discharge in said reaction chamber so that a reactive gas that is reactive with said workpiece under the plasma discharge is liberated from a material which is arranged in said reaction chamber.

2. A dry-etching method according to claim 1, wherein said material arranged in said reaction chamber is made of a high molecular weight resin containing fluorine atoms.

3. A dry-etching method according to claim 2, wherein said high molecular weight resin is at least one resin selected from the group consisting of a polytetrafluoroethylene resin, a polymonochloratrifluoroethylene resin, a tetrafluoroethylenehexafluoropropylene copolymer resin, a polyvinylidenefluoride resin, and a polyvinylfluoride resin.

4. A dry-etching method according to claim 1, wherein said workpiece is made of $SiO_2$ or phospho-silicate glass.

5. A dry-etching method according to claim 1, wherein said workpiece is made of a substrate selected from the group consisting of Si, Mo, W, Cr, TiW and $Si_3N_4$.

6. A dry-etching method according to claim 1, wherein, at said step (ii), said inactive gas is continuously supplied to the inside of said reaction chamber during the plasma discharge.

7. A dry-etching method according to claim 1, wherein at said step (ii), said inactive gas is supplied to the inside of said reaction chamber only before and during the start-up of the plasma discharge.

8. A dry-etching method according to claim 1, wherein the gas pressure in said reaction chamber is 1.3 to 1330 Pa.

9. A dry-etching method according to claim 8, wherein said gas pressure is 13 to 133 Pa.

10. A dry-etching method according to claim 4, wherein the gas pressure in said reaction chamber is 20 to 50 Pa.

11. A dry-etching method according to claim 1, wherein the reactive gas liberated from the material arranged in the reaction chamber is a fluorine-containing gas.

12. A dry-etching method according to claim 1, wherein the plasma discharge is effected with a power density of 0.1 to 1 $W/cm^2$ and a power frequency of from 0.1 to 20 MHz.

13. A dry-etching method according to claim 4, wherein said workpiece is selectively covered with a photoresist, and whereby the ratio of etching rate of the $SiO_2$ of phospho-silicate glass to the etching rate of the photoresist is increased relative to the etching rate ratio when introducing argon gas in step (i).

14. A dry-etching method according to claim 13, wherein said workpiece is made of an $SiO_2$ or phospho-silicate glass layer on a silicon substrate, and whereby the ratio of the etching rate of the $SiO_2$ or phospho-silicate glass to the etching rate of the photoresist or silicon is increased relative to the etching rate ratio when introducing argon gas in step (i).

15. A dry-etching method according to claim 4, wherein said workpiece is made of an $SiO_2$ or phospho-silicate glass layer on a silicon substrate, and whereby the ratio of the etching rate of the $SiO_2$ or phospho-silicate glass to the etching rate of the photoresist or silicon is increased relative to the etching rate ratio when introducing argon gas in step (i).

16. A dry-etching method according to claim 4, 10, 13, 14 or 15, wherein said workpiece includes phospho-silicate glass.

* * * * *